(12) United States Patent
Watanabe et al.

(10) Patent No.: US 6,522,195 B2
(45) Date of Patent: Feb. 18, 2003

(54) LOW NOISE AMPLIFIER HAVING BYPASS CIRCUITRY

(75) Inventors: Glenn A. Watanabe, Phoenix, AZ (US); Thomas E. Schiltz, Colorado Springs, CO (US); Sin Kai Henry Lau, Westborough, MA (US)

(73) Assignee: Motorola, Inc., Schaumburg, IL (US)

( * ) Notice: Subject to any disclaimer, the term of this patent is extended or adjusted under 35 U.S.C. 154(b) by 137 days.

(21) Appl. No.: 09/732,161

(22) Filed: Dec. 7, 2000

(65) Prior Publication Data

US 2002/0070809 A1 Jun. 13, 2002

(51) Int. Cl.[7] ................................................ H03F 1/14
(52) U.S. Cl. ......................................... 330/51; 330/151
(58) Field of Search ............................. 330/51, 86, 110, 330/151, 302

(56) References Cited

U.S. PATENT DOCUMENTS

| | | | |
|---|---|---|---|
| 4,820,940 A | | 4/1989 | Wachi et al. |
| 6,118,338 A | * | 9/2000 | Frank et al. ................... 330/51 |
| 6,201,441 B1 | * | 3/2001 | Suematsu et al. ............. 330/51 |
| 6,285,257 B1 | * | 9/2001 | Abe et al. ................. 330/86 X |
| 2002/0053947 A1 | * | 5/2002 | Macedo ...................... 330/151 |

* cited by examiner

*Primary Examiner*—Steven J. Mottola

(57) ABSTRACT

A low noise amplifier (10) having an amplifier mode and a bypass mode. In the amplifier mode the input signal received at an input terminal (12) is amplified by an amplifying transistor (40) and the output signal supplied at an output terminal (50). In the bypass mode the input signal is not amplified, but transferred by a bypass circuit (22) from the base to the collector of the amplifying transistor. An input impedance matching circuit (14) and an output impedance matching circuit (44), along with the bypass circuit (22) provide a constant input and output impedance when the low noise amplifier (10) operates in the amplifier mode and the bypass mode.

18 Claims, 1 Drawing Sheet

US 6,522,195 B2

LOW NOISE AMPLIFIER HAVING BYPASS CIRCUITRY

This invention is related, in general, to low noise amplifiers and, more specifically, to low noise amplifiers having an amplifier mode and a bypass mode.

It is common for a transmitted Radio Frequency (RF) signal received through an antenna to be amplified prior to being passed to a mixer for frequency conversion. The mixer modulates the received RF signal with a local oscillator signal and generates an Intermediate Frequency (IF) output signal having a frequency that is the difference of the received RF signal frequency and the local oscillator signal frequency. When the signal strength of the received RF signal is low, an amplifier provides signal gain prior to the RF signal being mixed. On the other hand, when the signal strength of the received RF signal is high, the RF signal is not amplified prior to being mixed to prevent overdriving the mixer.

Prior art amplifiers that switch operating modes between providing signal gain and not supplying signal gain, change the input and output impedances of the amplifier based on the mode of operation. Any impedance change at either the input or output of the amplifier causes undesired changes to the filters preceding and following the low noise amplifier. The filter before the low noise amplifier is needed to separate the receive signal from the transmitted signal. The filter following the low noise amplifier is needed to reject the image signal and is well known to those versed in the art. Both of these filters require a fixed input and output impedance, which is usually 50 ohms.

By now it should be appreciated that a low noise amplifier is needed having both an amplifying mode and a bypass mode and an input and output impedance that is substantially constant when the amplifier is switched between the modes of operation.

DETAILED DESCRIPTION OF THE DRAWINGS

Figure 1:
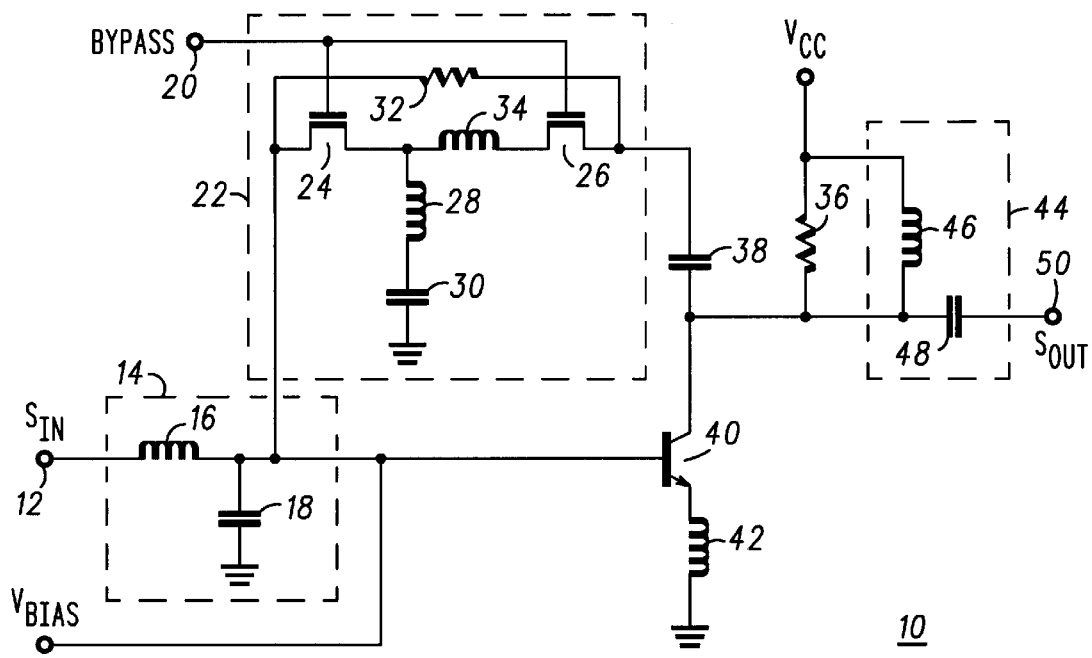
FIG. 1 is a circuit diagram for one embodiment of a low noise amplifier with a bypass circuit.

A signal $S_{IN}$ is supplied at an input terminal 12 of a low noise amplifier 10 and either amplified in an amplifier mode or not amplified in a bypass mode. The signal $S_{IN}$ has a frequency that ranges from about 900 megahertz (MHz) to about 5 gigahertz (GHz). The output signal $S_{OUT}$ supplied at output terminal 50 has a gain in the range of 9–12 decibels (dB) when low noise amplifier 10 operates in the amplifier mode and a gain (loss) of about −1.9 dB when a bypass signal (BYPASS) causes low noise amplifier 10 to operate in the bypass mode. Low noise amplifier 10 could be processed in any one of the technologies such as, for example, a Gallium Arsenide (GaAs), Silicon (Si), Silicon Germanium (SiGe), Complementary Metal Oxide Semiconductor (CMOS), or BICMOS (combination of bipolar and CMOS) technology.

Low noise amplifier 10 includes an impedance matching circuit 14 connected to input terminal 12 that provides an input impedance $Z_{IN}$. Impedance matching circuit 14 includes an inductor 16 having a first terminal connected to the input and a second terminal connected to the output of impedance matching circuit 14. A capacitor 18 is coupled between the output of impedance matching circuit 14 and a ground power conductor. Typically, inductor 16 has an inductance value of about 3 nanohenries (nh) and capacitor 18 has a capacitance value of about 2 picofarads (pf). The input impedance of the matching network comprised of inductor 16 and capacitor 18 has an input impedance value $Z_{IN}$ of about 50 ohms (Ω) and matches the 50 Ω impedance of the source (not shown) supplying the signal $S_{IN}$ at input terminal 12. The output of impedance matching circuit 14 is connected to the base of a gain setting transistor 40. The output impedance of impedance matching circuit 14 of about 75 Ω matches the input impedance of transistor 40 that is about 75 Ω.

The emitter of transistor 40 is coupled to the ground power conductor through an inductor 42 that represents the lead and wire bond parasitics associated with connecting the emitter of transistor 40 to the ground power conductor. Although transistor 40 is shown in FIG. 1 as an NPN transistor, transistor 40 could be a PNP transistor or a Field Effect Transistor (FET). The collector of transistor 40 is connected to a first terminal of a capacitor 38 and also coupled through a resistor 36 to a power conductor that receives a voltage $V_{CC}$. Capacitor 38 keeps transistors 24 and 26 operating in a linear region that provides a low on resistance, i.e., a low $R_{DS}$ (drain-source resistance), when low noise amplifier 10 operates in the bypass mode. Capacitor 38 has a capacitance value of about 1 pf and resistor 36 has a resistance value of about 400 Ω.

A bypass circuit 22 has an input connected to the base of transistor 40, a control input connected to terminal 20 for receiving the signal BYPASS, and an output connected to the second terminal of capacitor 38. The signal BYPASS has a logic zero value when low noise amplifier 10 operates in the amplifier mode and a logic one value when in the bypass mode. According to the strength of the received signal $S_{IN}$, a Received Signal Strength Indicator (RSSI) circuit (not shown) determines whether low noise amplifier 10 operates in the amplifier mode or in the bypass mode.

Bypass circuit 22 includes a first transistor 24 having a first current carrying terminal connected to the input terminal of bypass circuit 22. The second current carrying terminal of transistor 24 is coupled through an inductor 34 to a first current carrying terminal of a transistor 26. The second current carrying terminal of transistor 26 is coupled to the output terminal of bypass circuit 22. A resistor 32 is coupled between the input terminal and the output terminal of bypass circuit 22 and acts as a feedback element. Resistor 32 can be used to reduce the gain, improve the stability of the circuit, and to adjust the input and output impedance of the low noise amplifier. Bypass circuit 22 further includes an inductor 28 having a first terminal connected to the second current carrying terminal of transistor 24. The second terminal of inductor 28 is connected to the first terminal of a capacitor 30. The second terminal of capacitor 30 is connected to the ground power conductor. Inductors 28 and 34 have inductance values of about 2 nh and capacitor 30 has a capacitance value of about 20 pf.

Low noise amplifier 10 includes an impedance matching circuit 44 having an input connected to the collector of transistor 40 and an output connected to output terminal 50. Impedance matching circuit 44 includes an inductor 46 having a first terminal connected to the input of impedance matching circuit 44 and a second terminal connected to the power conductor that receives the voltage $V_{CC}$. A capacitor 48 has one terminal connected to the input of impedance matching circuit 44 and a second terminal connected to output terminal 50. Typically, inductor 46 has an inductance value of about 2 nh and capacitor 48 has a capacitance value of about 2 pf. The values for inductor 46 and capacitor 48 are selected so that the output impedance $Z_{OUT}$ has a value of about 50 ohms (Ω) and matches the 50 Ω impedance of an external circuit (not shown) connected to output terminal 50.

In operation, when low noise amplifier 10 is selected for operation in the amplifier mode, the BYPASS signal has a logic zero value that causes transistors 24 and 26 to be nonconductive, disabling the feed-forward signal path from the base of transistor 40 through bypass circuit 22 to the collector of transistor 40. The voltage VBIAS supplied to the base of transistor 40 forces the transistor into the normal operating range, amplifying the signal $S_{IN}$ received at input terminal 12 and supplying the amplified signal $S_{OUT}$ at output terminal 50, the signal gain being set by transistor 40, resistors 32 and 36 and the operating voltage VBIAS. Impedance matching circuit 14 causes the impedance at input terminal 12 to have an impedance value of about 50 Ω that matches the source impedance. The output impedance of impedance matching circuit 14 of 75 Ω matches the input impedance of transistor 40 that is set to about 75 Ω. At output terminal 50, impedance matching circuit 44 has an output impedance value of about 50 Ω that matches the load impedance of 50 Ω. The input impedance of impedance matching circuit 44 is about 400 Ω that matches the output impedance of transistor 40 and resistor 36 due to the load resistor value of resistor 36 that is about 400 Ω.

On the other hand, when low noise amplifier 10 operates in the bypass mode, the BYPASS signal has a logic one value that causes transistors 24 and 26 to be conductive. The voltage VBIAS has a value that is less than the base-emitter on voltage, forcing transistor 40 to be nonconductive. Thus, the signal $S_{IN}$ at input terminal 12 is transferred through transistors 24 and 26 to output terminal 50, and therefore, bypassing transistor 40. In the bypass mode the signals $S_{IN}$ and $S_{OUT}$ have substantially the same amplitude, i.e., transistor 40 does not amplify the signal $S_{IN}$. It should be pointed out that capacitor 30 is a Direct Current (DC) blocking capacitor, providing an Alternating Current (AC) ground at the first terminal of the capacitor.

In the bypass mode, the inductance values for inductors 28 and 34 and the capacitance value for capacitor 30 are selected by design for impedance matching. In other words, proper values of inductance for inductors 28 and 34 and capacitance for capacitor 30 cause bypass circuit 22 to transform the 400 Ω resistance of resistor 36 at the output of bypass circuit 22 to a 75 Ω impedance at the input of bypass circuit 22. It should be noted that in the active mode, transistors 24 and 26 are both nonconducting and the output of impedance matching circuit 14 sees an impedance of 75 Ω from the base of transistor 40. The combination of transistor 24 at the input of bypass circuit 22 and transistor 26 at the output of bypass circuit 22 prevent inductors 28 and 34 and capacitor 30 from affecting the either the input or output impedance of low noise amplifier 10 operating in the active mode.

In the bypass mode, the output of impedance matching circuit 14 again sees an impedance of 75Ω. This time, however, the 75 Ω impedance at the output of impedance matching circuit 14 is not from the base of transistor 40, but rather from the impedance transformation that takes place through bypass circuit 22, where the 400 Ω from resistor 36 looks like an impedance of 75Ω. Thus, in accordance with the present embodiment, the impedance at the output of impedance matching circuit 14 is 75 Ω when operating low noise amplifier 10 in either the active mode or the bypass mode.

A low noise amplifier has been shown in FIG. 1 that provides gain in an amplifier mode and no signal gain in a bypass mode. The low noise amplifier further provides a constant input impedance and a constant output impedance when low noise amplifier 10 operates in either the amplifier mode or the bypass mode.

Figure 2:
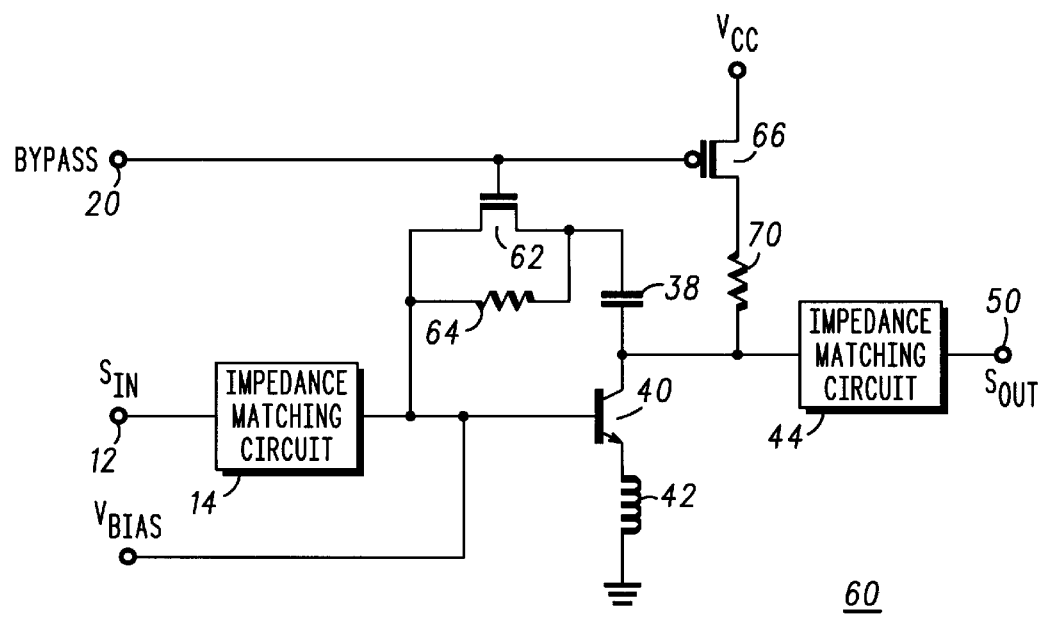
FIG. 2 is a circuit diagram for another embodiment of a low noise amplifier with a bypass circuit.

FIG. 2 is a circuit diagram for another embodiment of a low noise amplifier 60 having a bypass circuit. The same reference numbers are used in the figures to denote the same elements. The signal $S_{IN}$ is supplied at input terminal 12 and either amplified in an amplifier mode or not amplified in a bypass mode. The signal $S_{IN}$ at input terminal 12 is received at an input of impedance matching circuit 14. The output of impedance matching circuit 14 is connected to the base of transistor 40. The emitter of transistor 40 is coupled through an inductor 42 to a ground power conductor. The collector of transistor 40 is connected to a first terminal of a capacitor 38 that has a capacitance value of about 3 pf.

A feed-forward path for the signal $S_{IN}$ to bypass transistor 40 is provided through transistor 62, where one current terminal is connected to the base of transistor 40 and the other current terminal is coupled through capacitor 38 to the collector of transistor 40. A resistor 64 is coupled across the first and second current terminals of transistor 62. Resistor 64 can be used to reduce the gain, improve the stability of the circuit, and to adjust the input and output impedance of the low noise amplifier. The control terminal of transistor 62 is connected to terminal 20 for receiving the signal BYPASS. The signal BYPASS has a logic zero value when low noise amplifier 60 operates in the amplifier mode and a logic one value when in the bypass mode. In the bypass mode the signal $S_{IN}$ is not amplified by transistor 40.

A P-channel FET 66 also has a gate coupled for receiving the signal BYPASS. One current terminal of FET 66 is connected to a Vcc power conductor and the other current terminal is coupled through a resistor 70 to the collector of transistor 40. Resistor 70 has a resistance value of about 150 Ω. Low noise amplifier 60 further includes an impedance matching circuit 44 having an input connected to the collector of transistor 40 and an output connected to output terminal 50. Impedance matching circuit 44 is designed to have an output impedance $Z_{OUT}$ having a value of about 100 ohms (Ω) that matches the 100 Ω impedance of an external circuit (not shown) connected to output terminal 50.

In operation, when the BYPASS signal has a logic zero value low noise amplifier 60 is selected for operation in the amplifier mode. In the amplifier mode transistor 62 is nonconductive, disabling the feed-forward signal path. The voltage VBIAS supplied to the base of transistor 40 forces transistor 40 into the normal operating range, amplifying the signal $S_{IN}$ received at input terminal 12 and supplying the amplified signal $S_{OUT}$ at output terminal 50. Impedance matching circuit 14 causes the impedance at input terminal 12 to have an impedance value substantially equivalent to 50 Ω, that matches the source impedance of 50 Ω. The output impedance of impedance matching circuit 14 is 100 Ω that matches the input impedance of transistor 40 which is set to 100 Ω. Transistor 66 is conductive in the amplifier mode and the resistance of resistor 70 is in parallel with the collector impedance of transistor 40. The parallel resistor combination at the input to impedance matching circuit 44 is transformed by impedance matching circuit 44 to provide an output impedance of 100 Ω at output terminal 50 that matches the impedance of the external load (not shown) connected to terminal 50.

On the other hand, when low noise amplifier 10 operates in the bypass mode, the BYPASS signal has a logic one value that causes transistor 62 to be conductive and transistor 66 to be nonconductive. The voltage VBIAS has a value that is less than the base-emitter on voltage, forcing transistor 40 to be nonconductive. Thus, the signal $S_{IN}$ at input terminal 12 is transferred through transistor 62 to output terminal 50, bypassing transistor 40. In the bypass mode the signals $S_{IN}$ and $S_{OUT}$ have substantially the same amplitude, i.e., transistor 40 does not amplify the signal $S_{IN}$.

In the bypass mode, the impedance of the external load (not shown) connected to terminal 50 is seen by impedance matching circuit 14 because transistor 66 is nonconductive, removing the influence of resistor 70. Impedance matching circuit 14 transforms the impedance of the external load at output terminal 50 to an input impedance of 50 Ω at the input terminal 12. By way of example, an impedance of 100 Ω from an external device connected at output terminal 50 is seen as an input impedance of about 50 Ω at input terminal 12.

By now it should be appreciated that a low noise amplifier has been shown that provides gain in an amplifier mode and no signal gain in a bypass mode. The low noise amplifier further provides a constant input impedance and a constant output impedance when the low noise amplifier operates in either the amplifier mode or the bypass mode.

What is claimed is:

1. A low noise amplifier, comprising:
   a first transistor having an emitter coupled to a first power conductor and a collector coupled to a second power conductor; and
   a bypass circuit having an input coupled to a base of the first transistor and an output coupled to the collector of the first transistor, the bypass circuit including
      a second transistor having a control terminal coupled for receiving a bypass signal and a first terminal coupled to the input of the bypass circuit,
      a first inductor having a first terminal coupled to a second terminal of the second transistor,
      a second inductor having a first terminal coupled to the second terminal of the second transistor and a second terminal coupled to the first power conductor, and
      a third transistor having a control terminal coupled for receiving the bypass signal, a first terminal coupled to a second terminal of the first inductor, and a second terminal coupled to the output of the bypass circuit.

2. The low noise amplifier of claim 1, further comprising a circuit load having a first terminal coupled to the collector of the first transistor and a second terminal coupled to a second power conductor.

3. The low noise amplifier of claim 1, further comprising a resistor having a first terminal coupled to the input of the bypass circuit and a second terminal coupled to the output of the bypass circuit.

4. The low noise amplifier of claim 1, further comprising a first impedance matching circuit having an input coupled for receiving an input signal and an output coupled to the input of the bypass circuit.

5. The low noise amplifier of claim 1, further comprising a second impedance matching circuit having an input coupled to the collector of the first transistor and an output coupled to an output of the low noise amplifier.

6. The low noise amplifier of claim 1, further comprising a capacitor having a first terminal coupled to the collector of the first transistor and a second terminal coupled to the output of the bypass circuit.

7. The low noise amplifier of claim 1, further comprising an inductor coupled between the emitter of the first transistor and the first power conductor.

8. An amplifier circuit having a feed-forward path between a base and a collector of a gain setting transistor, the feed-forward path comprising:
   a first transistor having a first current terminal coupled to the base of the gain setting transistor and a control terminal coupled for receiving a bypass signal;
   a first inductor having a first terminal coupled to a second current terminal of the first transistor; and
   a second transistor having a control terminal coupled to the control terminal of the first transistor, a first current terminal coupled to a second terminal of the first inductor, and a second current terminal coupled to the collector of the gain setting transistor.

9. The amplifier circuit of claim 8, wherein the feed-forward path further comprises a second inductor having a first terminal coupled to the first terminal of the first inductor and a second terminal coupled to a power conductor.

10. The amplifier circuit of claim 9, wherein the feed-forward path further comprises a capacitor having a first terminal coupled to the second terminal of the second inductor and a second terminal coupled to the power conductor.

11. The amplifier circuit of claim 8, wherein the feed-forward path further comprises a resistor coupled between the base and the collector of the gain setting transistor.

12. A low noise amplifier, comprising:
   a first transistor having a control terminal coupled for receiving an input signal and a first current terminal coupled to a ground power conductor;
   a second transistor having a control terminal coupled for receiving a bypass signal, a first current terminal coupled to the control terminal of the first transistor, and a second current terminal coupled to a second current terminal of the first transistor; and
   a third transistor having a control terminal coupled to the control terminal of the second transistor, a first current terminal coupled to the second current terminal of the first transistor, and a second current terminal coupled to a Vcc power conductor.

13. The low noise amplifier of claim 12, further comprising a resistor coupled between the second current terminal of the first transistor and the first current terminal of the third transistor.

14. The low noise amplifier of claim 12, further comprising an inductor coupled between the first current terminal of the first transistor and the ground power conductor.

15. The low noise amplifier of claim 12, further comprising a first capacitor coupled between the second current terminal of the first transistor and the second current terminal of the second transistor.

16. The low noise amplifier of claim 15, further comprising a first impedance matching circuit having an input coupled for receiving the input signal and an output coupled to the control terminal of the first transistor.

17. The low noise amplifier of claim 16, further comprising a second impedance matching circuit having an input coupled to the second current terminal of the first transistor and an output for supplying an output signal of the low noise amplifier.

18. The low noise amplifier of claim 12, further comprising a resistor coupled between the first and second current terminals of the second transistor.

* * * * *